US009704731B2

(12) United States Patent
Miya et al.

(10) Patent No.: US 9,704,731 B2
(45) Date of Patent: Jul. 11, 2017

(54) PLASMA PROCESSING APPARATUS AND PLASMA PROCESSING METHOD

(71) Applicant: Hitachi High-Technologies Corporation, Tokyo (JP)

(72) Inventors: Go Miya, Hachioji (JP); Masaru Izawa, Hino (JP); Takumi Tandou, Hikari (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 349 days.

(21) Appl. No.: 14/514,587

(22) Filed: Oct. 15, 2014

(65) Prior Publication Data

US 2015/0031213 A1 Jan. 29, 2015

Related U.S. Application Data

(62) Division of application No. 13/928,645, filed on Jun. 27, 2013, now abandoned.

(30) Foreign Application Priority Data

Jun. 28, 2012 (JP) ................................ 2012-144898

(51) Int. Cl.
*H01L 21/302* (2006.01)
*H01L 21/67* (2006.01)
(Continued)

(52) U.S. Cl.
CPC .. *H01L 21/67069* (2013.01); *H01J 37/32724* (2013.01); *H01J 37/32825* (2013.01);
(Continued)

(58) Field of Classification Search
CPC ............ H01L 21/3065; H01L 21/67017; H01L 21/67019; H01L 21/6706; H01L 21/67069;
(Continued)

(56) References Cited

U.S. PATENT DOCUMENTS 7,838,792 B2    11/2010  Tandou et al.
2008/0121344 A1*  5/2008  Aramaki ............. C23C 16/4581
                                            156/345.43

(Continued)

FOREIGN PATENT DOCUMENTS

JP        2008-34409         2/2008

*Primary Examiner* — Lan Vinh
(74) *Attorney, Agent, or Firm* — Baker Botts L.L.P.

(57) ABSTRACT

A plasma processing method is provided for a plasma processing apparatus which includes a plurality of upstream-side expansion valves and a plurality of downstream-side expansion valves connected to respective refrigerant inlets and respective refrigerant outlets to adjust a flow rate or a pressure of a refrigerant flowing into the respective refrigerant inlets and a flow rate or a pressure of a refrigerant flowing out from the respective refrigerant outlets. The method includes adjusting openings of the upstream-side expansion valves and openings of the downstream-side expansion valves so that no change in flow rate of the refrigerant occurs in a plurality of refrigerant channels between the plurality of upstream-side expansion valves and the plurality of downstream-side expansion valves via the plurality of refrigerant channels in a refrigeration cycle allowing the refrigerant to flow therein.

4 Claims, 7 Drawing Sheets

(51) Int. Cl.
   *H01L 21/3065*   (2006.01)
   *H01J 37/32*   (2006.01)
(52) U.S. Cl.
   CPC .... *H01L 21/3065* (2013.01); *H01L 21/67017* (2013.01); *H01L 21/67109* (2013.01); *H01J 2237/2001* (2013.01); *H01J 2237/334* (2013.01)
(58) Field of Classification Search
   CPC ......... H01J 2237/2001; H01J 2237/334; H01J 37/32724; H01J 37/32825; H01J 37/3282
   USPC ............ 438/706, 710, 712, 714; 156/345.36, 156/345.37, 345.52, 345.53
   See application file for complete search history.

(56)       References Cited

U.S. PATENT DOCUMENTS

| | | |
|---|---|---|
| 2008/0178608 A1 | 7/2008 | Tandou et al. |
| 2008/0203925 A1* | 8/2008 | Tandou ............. H01J 37/32431 315/111.21 |
| 2008/0289767 A1 | 11/2008 | Tandou et al. |
| 2009/0277883 A1* | 11/2009 | Tandou ............. H01J 37/32623 219/121.49 |
| 2010/0126666 A1 | 5/2010 | Tandou et al. |
| 2011/0132541 A1* | 6/2011 | Tandou ............. H01L 21/67017 156/345.27 |
| 2012/0186745 A1* | 7/2012 | Miya ................ H01J 37/32715 156/345.27 |
| 2014/0004706 A1 | 1/2014 | Miya et al. |

* cited by examiner

PLASMA PROCESSING APPARATUS AND PLASMA PROCESSING METHOD

CROSS-REFERENCE TO RELATED APPLICATIONS

This application is a divisional of U.S. patent application Ser. No. 13/928,645, filed Jun. 27, 2013, the entire contents of which is hereby incorporated by reference.

BACKGROUND OF THE INVENTION

The present invention relates to a plasma processing apparatus and a processing method for performing processing such as etching using plasma formed in a processing chamber inside a vacuum container by mounting a sample, which is a substrate such as a semiconductor wafer, on an upper surface of a sample stage arranged in the processing chamber, and relates to a plasma processing apparatus and a plasma processing method for performing the processing while making a refrigerant flow through refrigerant channels inside the sample stage included in a refrigeration cycle to adjust a temperature of the sample stage.

Conventionally, in semiconductor device manufacturing processes, plasma processing is performed on a sample such as a semiconductor wafer by means of a plasma etching apparatus or a plasma CVD apparatus. In these types of plasma processing, the temperature of the sample largely affects the result of the processing. More specifically, in plasma etching, the temperature of the sample affects the resulting dimensions and/or shape of a pattern formed at a surface of the sample by etching, and in plasma CVD processing, the temperature of the sample affects the quality and/or film formation rate of a film formed on a surface of the sample. Therefore, in these types of plasma processing, in order to enhance the quality of processing performed on a surface of the sample substrate, it is very important to manage the temperature of the sample.

In these types of plasma processing, in order to control the temperature of a sample, techniques in which the temperature inside a sample stage that holds a sample and the temperature of a sample holding surface are adjusted by means of a temperature adjustment unit arranged inside the sample stage have been employed. For example, an apparatus system in which refrigerant channels are formed inside a sample stage and a liquid refrigerant is made to flow in the channels to adjust the temperature of the sample stage by means of heat transfer, whereby the sample is adjusted to a desired temperature, is used. In such case, a refrigerant temperature adjusted to a desired temperature, is used. In such case, a refrigerant temperature adjustment section (for example, a chiller unit) is connected to the sample stage via pipings, a refrigerant adjusted to a predetermined temperature by a cooling apparatus or a heating apparatus inside the refrigerant temperature adjustment section is supplied into the channels inside the sample stage, and absorbs heat input from plasma and then is returned to the refrigerant temperature adjustment section.

Such refrigerant temperature adjustment section is configured so as to temporarily store the liquid refrigerant in a refrigerant storage tank and adjust the temperature of the refrigerant and then supplies the refrigerant to the sample stage. In this configuration, since a large quantity of refrigerant is used for temperature adjustment, the heat capacity of the refrigerant is large, and thus, the configuration is advantageous in maintaining the temperature of the sample constant even if the amount of heat input to the sample and the sample stage is changed. However, an attempt to largely and promptly change the temperatures of the sample and the sample stage in an active manner causes the problem of difficulty in prompt temperature change because of the large heat capacity of the refrigerant. Furthermore, heat exchange between the liquid refrigerant and the channels is performed only by means of heat transfer and thus, a small quantity of heat transfer is also one of causes that hinder prompt change in temperature of the sample stage and the sample.

Meanwhile, along with an increase in diameter of semiconductor wafers, which are samples, in the aforementioned plasma processing in semiconductor device manufacturing, power applied to the samples during the processing has been increasing, and as a result, the amount of heat input to the sample and the sample stage has become larger than ever. Therefore, there is a demand for a technique that stably adjusts the temperature of a semiconductor substrate at high speed and with high accuracy even upon input of a large amount of heat. Furthermore, because of the growing complexity of semiconductor device structures as well as provision of multiple layers on semiconductor substrate surface, it is desired to promptly and properly adjust the temperature of a sample according to each of processing steps that process respective films.

For responding to the above issues, direct expansion-type refrigerant temperature adjustment techniques have been proposed. In the expansion-type refrigerant temperature adjustment techniques, a path in which a refrigerant for adjusting a temperature of a sample stage is circulated is configured as a heat cycle including a compressor, a condenser, an expansion valve and an evaporator, and the refrigerant is brought to boiling and evaporated in refrigerant channels in the sample stage, whereby the sample stage acts as an evaporator in the heat cycle. As an example of such techniques, that disclosed in JP-A-2008-34409 (corresponding to U.S. Pat. No. 7,838,792) is known.

SUMMARY OF THE INVENTION

In a configuration of the heat cycle described in JP-A-2008-34409, for example, hydrochlorofluorocarbon R410a is used as a refrigerant and is introduced into refrigerant channels inside a sample stage to use evaporative latent heat of the refrigerant in a gas-liquid two-phase flow state for heat exchange between the refrigerant and walls of the channels, in order to respond to a large amount of heat input to a sample and the sample stage. Furthermore, adjusting an opening of an expansion valve to quickly adjust a pressure of the refrigerant in the channels, enabling a temperature of the refrigerant to be quickly changed, and as a result, the temperatures of the sample stage and the sample can quickly be changed.

Furthermore, JP-A-2008-34409 discloses a configuration in which refrigerant channels are concentrically arranged on the inner and outer sides of an inner portion of the sample stage and the refrigerant is made to flow in the respective channels, achieving temperature distribution in a radial direction of the sample stage. In other words, a flow valve is provided on the upstream side of each channel and openings of the valves are adjusted, enabling pressures of the refrigerant in the respective routes to be independently controlled, and as a result, the refrigerant temperatures in the respective routes can be controlled. Consequently, the temperature distributions in the sample stage and the sample can be controlled.

Also, where a refrigerant flowing in refrigerant channels inside a sample stage is in a gas-liquid two-phase flow state, even if the refrigerant absorbs heat input from plasma, the temperature of the refrigerant does not increase beyond a boiling point thereof, and thus, the refrigerant temperature during the refrigerant circulating in the refrigerant channels is maintained constant.

Therefore, a temperature distribution in a circumferential direction of a circular sample stage becomes closer to a uniform distribution, and as a result, a temperature distribution in a circumferential direction of a semiconductor wafer, which is a body to be processed, can be made to be closer to a uniform distribution.

However, the aforementioned related technique has problems because of insufficiency in consideration of the following points. In other words, JP-A-2008-34409 has the problem that a refrigerant merging point is provided downstream of an outlet of each channel, making it possible to provide a large pressure difference between the respective channels, resulting in difficulty in providing a large difference in condition, for example, temperature or evaporation temperature, of a refrigerant between the respective channels. Therefore, it has been difficult to efficiently provide a distribution with a large temperature difference in a surface of a sample in a short period of time.

Still furthermore, in ordinary plasma processing, a refrigerant introduced into a sample stage is set to a predetermined temperature or an evaporation temperature, and adjustment is made so that the sample stage and a sample have desired temperatures suitable for the processing. However, JP-A-2008-34409 mentioned above discloses no specific method for adjusting a refrigerant to a target temperature.

Furthermore, employment of independent refrigerant temperature adjustment units, for example, refrigeration cycles, are connected to respective channels inside a sample stage requires a number of refrigeration cycles, the number being equal to the number of paths, resulting in an increase in size and cost of the semiconductor manufacturing apparatus.

The present invention is intended to provide a plasma processing apparatus and a plasma processing method that efficiently achieve a temperature or a temperature distribution in a sample stage on which a sample is mounted in a plasma processing apparatus in which refrigerant channels in the sample stage are connected to a refrigeration cycle as a part thereof to adjust the temperature of the sample stage.

In order to provide such a plasma processing apparatus, the plasma processing apparatus is configured to include a processing chamber that is arranged in a vacuum container and allows plasma to be formed therein, a sample stage on which a sample, which is an object to be processed by the plasma, is mounted, the sample stage including a plurality of refrigerant channels that are concentrically arranged and allow a refrigerant to flow inside and functioning as a first evaporator, a refrigerant inlet and a refrigerant outlet arranged in each of the plurality of refrigerant channels, and an exhaust unit that exhausts an inside of the processing chamber for pressure reduction, the apparatus including:

a plurality of upstream-side expansion valves and a plurality of downstream-side expansion valves that are connected to the respective refrigerant inlets and the respective refrigerant outlets and adjust a flow rate or a pressure of a refrigerant flowing into the respective refrigerant inlets and a flow rate or a pressure of a refrigerant flowing out from the respective refrigerant outlets; and a refrigeration cycle including a compressor, a condenser, the plurality of upstream-side expansion valves, the plurality of refrigerant channels, the plurality of downstream-side expansion valves and a second evaporator connected in this order via a refrigerant duct, and allowing the refrigerant to flow in the order, wherein openings of the plurality of upstream-side expansion valves and openings of the plurality of downstream-side expansion valves are adjusted so that no change in flow rate of the refrigerant occurs in a plurality of refrigerant paths between the plurality of upstream-side expansion valves and the plurality of downstream-side expansion valves via the plurality of refrigerant channels.

In order to provide such a plasma processing method, the plasma processing method for processing a sample that is an object to be processed by plasma, by mounting the sample on an upper surface of a sample stage arranged in a processing chamber inside a vacuum container and forming the plasma in the processing chamber, the sample stage including a refrigerant inlet and a refrigerant outlet arranged in each of a plurality of refrigerant channels that are concentrically arranged inside the sample stage and allow a refrigerant to flow inside, and functioning as a first evaporator, the sample stage is included in a refrigeration cycle including a plurality of upstream-side expansion valves and a plurality of downstream-side expansion valves connected to the respective refrigerant inlets and the respective refrigerant outlets to adjust a flow rate or a pressure of a refrigerant flowing into the respective refrigerant inlets and a flow rate or a pressure of a refrigerant flowing out from the respective refrigerant outlets, in which a compressor, a condenser, the plurality of upstream-side expansion valves, the plurality of refrigerant channels, the plurality of downstream-side expansion valves and a second evaporator are connected in this order via a refrigerant duct to allow the refrigerant to flow therethrough in the order, the method including the step of:

adjusting openings of the plurality of upstream-side expansion valves and openings of the plurality of downstream-side expansion valves so that no change in flow rate of the refrigerant occurs in a plurality of refrigerant paths between the plurality of upstream-side expansion valves and the plurality of downstream-side expansion valves via the plurality of refrigerant channels.

According to the present invention, dry-out of a temperature-adjusted fluid to be introduced into a sample stage can be prevented and a temperature of the temperature-adjusted fluid can efficiently be controlled.

Other objects, features and advantages of the invention will become apparent from the following description of the embodiments of the invention taken in conjunction with the accompanying drawings.

DETAILED DESCRIPTION OF THE EMBODIMENTS

Figure 1:
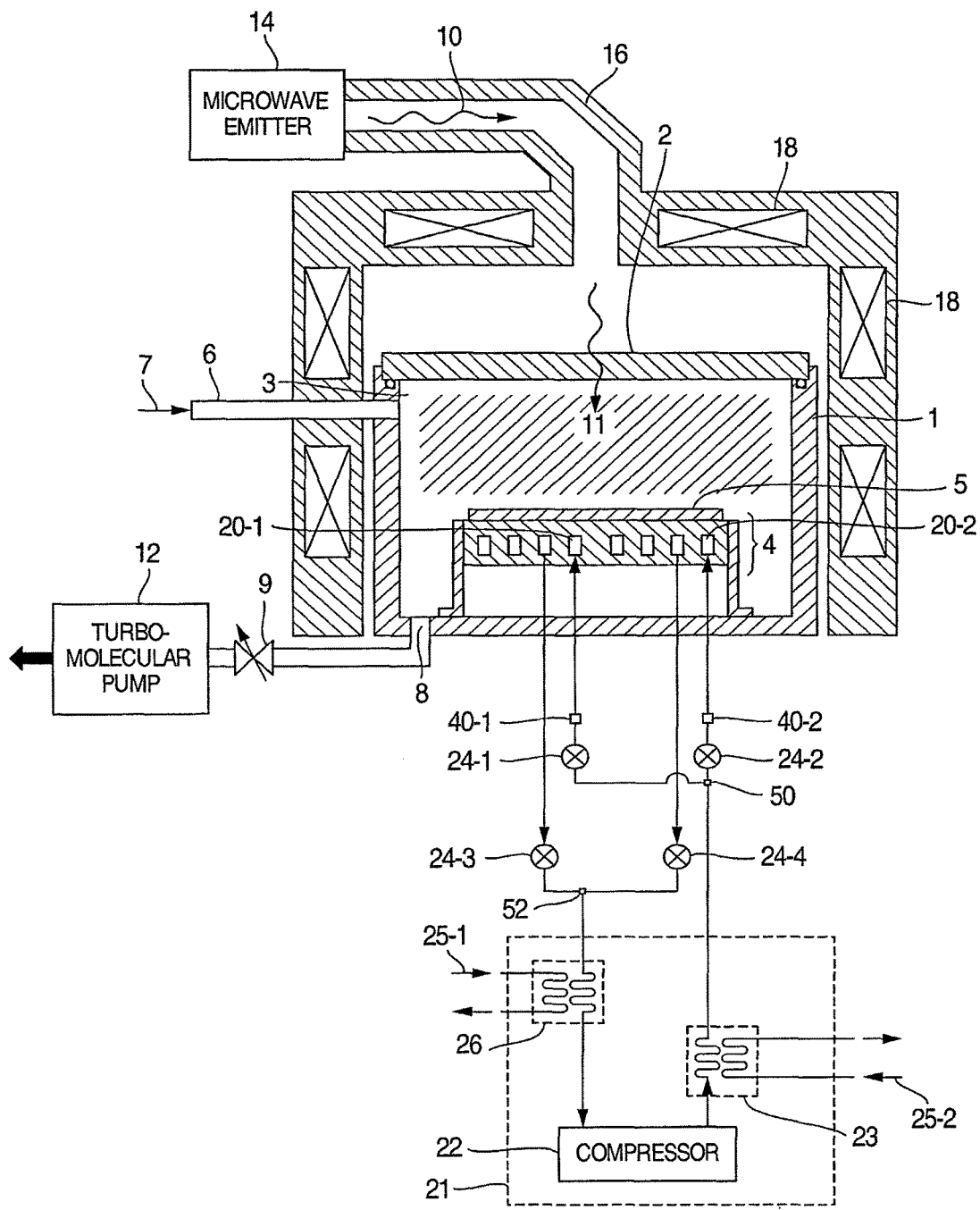
FIG. 1 is a vertical cross-sectional diagram illustrating an overview of a configuration of a plasma processing apparatus according to an embodiment of the present invention.

An embodiment of the present invention will be described below with reference to the drawings.

JP-A-2008-34409 described above discloses a technique in which two channels are concentrically arranged on the inner side and the outer side of a sample stage connected to a refrigeration cycle as refrigerant channels inside the sample stage, and a refrigerant is made to flow in each of the channels after passage through a compressor and a condenser included in one refrigeration cycle to form a temperature distribution in the sample stage. In this technique, a flow valve is provided on the upstream side of each of the channels, enabling pressures of refrigerants in the respective channels to be independently controlled by adjusting openings of the flow valves, and as a result, temperature distributions of the sample stage and a sample can be controlled by adjusting temperatures of the respective refrigerants. However, because a refrigerant merging point exists downstream of outlets of the respective channels, a difference in pressure between the respective routes cannot be expanded, resulting in difficulty in increasing a difference in temperature between the refrigerants in the respective channels. Therefore, there is the problem of difficulty in responding to a case where it is desired to expand a temperature difference within a plane of a sample.

Still furthermore, in normal plasma processing, a refrigerant introduced to a sample stage is set to a certain target temperature and the sample stage and a sample are adjusted to respective desired temperatures to perform the processing. However, JP-A-2008-34409 discloses no specific method for adjusting a refrigerant to a target temperature.

Still furthermore, pipings bifurcated from the refrigerant path in the refrigeration cycle are arranged in parallel and connected to respective inlets of the two refrigerant channels, and two pipings arranged in parallel are connected to outlets of the channels, a valve is provided on each of the pipings, and the two pipings are merged on the downstream side and connected to the compressor. In this configuration, for example, if an opening of the valve connected to the outer-side channel is increased to change a temperature of a refrigerant on the outer side with an opening of the valve connected to the inner-side channel unchanged in order to maintain a temperature of a refrigerant in the inner-side refrigerant channel, a flow rate of the refrigerant flowing to the outer-side channel is increased while a flow rate of the refrigerant flowing into the inner-side channel is decreased.

As a result, despite of the opening of the valve for the inner-side channel being unchanged, the temperature of the refrigerant in the inner-side channel is decreased. In other words, the problem that adjustment of an opening of a valve for one channel affects a temperature of a refrigerant in the other channel occurs. In such situation, what is called hunting occurs, e.g., change in the temperature of the refrigerant in the inner-side channel resulting in change in the temperature of the refrigerant in the outer-side channel, or conversely, correction of the temperature on the outer periphery side resulting in change in the temperature on the inner side, causing the problem of difficulty in adjustment of the temperature of the refrigerant and thus adjustment of the temperatures and temperature distributions of the sample stage and the sample.

Furthermore, for example, if the opening of the valve for one channel is made to be extremely small, the flow rate of a refrigerant in the channel becoming extremely small, increasing the risk of occurrence of what is called dry-out, i.e., the refrigerant including one in a liquid state being completely evaporated while the refrigerant flows in the channel. If dry-out of a refrigerant occurs in a channel, the temperature of the refrigerant in the channel sharply rises, a temperature distribution in the sample stage in a direction in which the refrigerant flows in the channel in the sample stage substantially changes, resulting in the problem of a temperature distribution in a circumferential direction of the sample such as a semiconductor wafer departing from a desired distribution.

As a solution to these problems, employment of a technique of connecting independent refrigerant temperature adjustment units such as refrigeration cycles to the respective channels requires a number of refrigerant temperature adjustment units, the number being equal to the number of channels, resulting in an increase in size and cost of the semiconductor manufacturing apparatus, which cannot be considered as an effective solution.

The present embodiment is intended to solve the aforementioned problems, and provide a plasma processing apparatus employing a direct expansion-type temperature adjustment unit for adjustment of a temperature distribution in a sample and efficiently enabling adjustment of temperatures of refrigerants flowing and circulating in a plurality of refrigerant channels in a sample stage and thus achievement of temperatures and temperature distributions of the sample stage and the sample.

Embodiment

An embodiment of the present invention will be described below with reference to FIGS. 1 to 6. FIG. 1 is a vertical cross-sectional diagram schematically illustrating an overview of a configuration of a plasma processing apparatus according to an embodiment of the present invention.

In the Figure, in the plasma processing apparatus, an electric field and magnetic field forming unit for forming plasma is arranged above a cylindrical vacuum container 1 and an exhaust unit that exhausts an inside of the vacuum container 1 is connected to a lower portion of the cylindrical vacuum container 1. A processing chamber 3, which is a space arranged inside the vacuum container 1, is a space whose pressure is reduced and in which a sample 5 to be processed, which is in the form of a substrate such as a semiconductor wafer, is arranged and processed.

At an upper portion of the vacuum container 1, a lid 2, which is a circular plate of a dielectric material such as quartz and provides a lid positioned above the processing chamber 3 and defining the inside of the vacuum container 1 and the processing chamber 3 in an air-tight manner, is arranged. At a lower portion of the processing chamber 3, a cylindrical sample stage 4 is arranged, and the sample 5 is held and transferred by an arm of a non-illustrated transfer robot arm to/from an upper surface of the sample stage 4, which is a mounting surface having a circular shape so as to conform to a shape of the sample 5, in the processing chamber 3.

A gas introduction tube 6 is connected to an upper portion of the processing chamber 3, and a process gas 7 that flows in the gas introduction tube 6 is introduced to the processing chamber 3 for performing etching via at least one (desirably a plurality of) introduction port(s) connected to the gas introduction tube 6. At a lower portion of the processing chamber 3 below the sample stage 4, an exhaust port 8 is arranged, and the process gas 7 introduced into the processing chamber 3 and/or a reaction product generated as a result of etching pass through the exhaust port 8 and are discharged to the outside of the processing chamber 3. The exhaust port 8 is connected to a vacuum pump such as a turbo-molecular pump 12 with a pressure adjustment valve 9 interposed therebetween, and an opening of the pressure adjustment valve 9 is adjusted, whereby an exhaust gas flow rate of the vacuum pump is adjusted and the pressure of the processing chamber 3 is adjusted to a pressure with a predetermined degree of vacuum (no more than 4 Pa in the present embodiment) according to a balance between the flow rate of the vacuum pump and a flow rate of the introduced process gas 7.

Above the processing chamber 3, an electric field or magnetic field generation device is arranged. In the present embodiment, for an electric field, microwave 10 emitted from a microwave emitter 14 such as a magnetron is used. Microwave 10 generated by the microwave emitter 14 arranged at an end portion of the waveguide 16 propagates horizontally and then downward in a vertical direction in the waveguide 16 and forms an electric field in a predetermined mode in a resonance section, which is a cylindrical space with the lid 2 at the upper portion of the processing chamber 3 as a bottom surface thereof, and the electric field penetrates the lid 2 and is introduced into the processing chamber 3 from above.

Furthermore, above the lid 2 and in an outer periphery of sidewalls of a cylindrical portion that forms the processing chamber 3 of the vacuum container 1, solenoidal coils 18 for forming a magnetic field upon supply of direct power are arranged. Magnetic fields generated by the solenoidal coils 18 are introduced into the processing chamber 3, and interact with the microwave 10 introduced into the processing chamber 3, thereby making atoms and molecules of the process gas 7 form plasma 11 in the processing chamber 3.

Using the plasma 11, etching is performed on a film structure that is formed on an upper surface of the sample 5 in advance and includes a plurality of film layers. The film structure in the present embodiment includes a mask layer of, e.g., a resin photoresist at an upper portion thereof and at least one gate, metal or insulating film layer, which is an object to be processed, arranged below the photoresist.

Also, in the present embodiment, in order to adjust a temperature of the sample 5 so as to fall within a range of values suitable for the processing, channels for a refrigerant, which is a medium for heat exchange, are arranged inside the sample stage 4. Inside each refrigerant channel 20, hydrochlorofluorocarbon R410a circulates as a refrigerant in such a manner that the refrigerant enters from an inlet of the refrigerant channel 20, is evaporated as a result of heat exchange with a member of the sample stage 4 inside the refrigerant channel 20 in the sample stage 4 and flows from an outlet of the refrigerant channel 20 to the outside of the sample stage 4, and then, as described later, flows through a refrigeration cycle in which the refrigerant condenses and devolatilized again and flows into the sample stage 4 via the inlet of the refrigerant channel 20 again.

Figure 2:
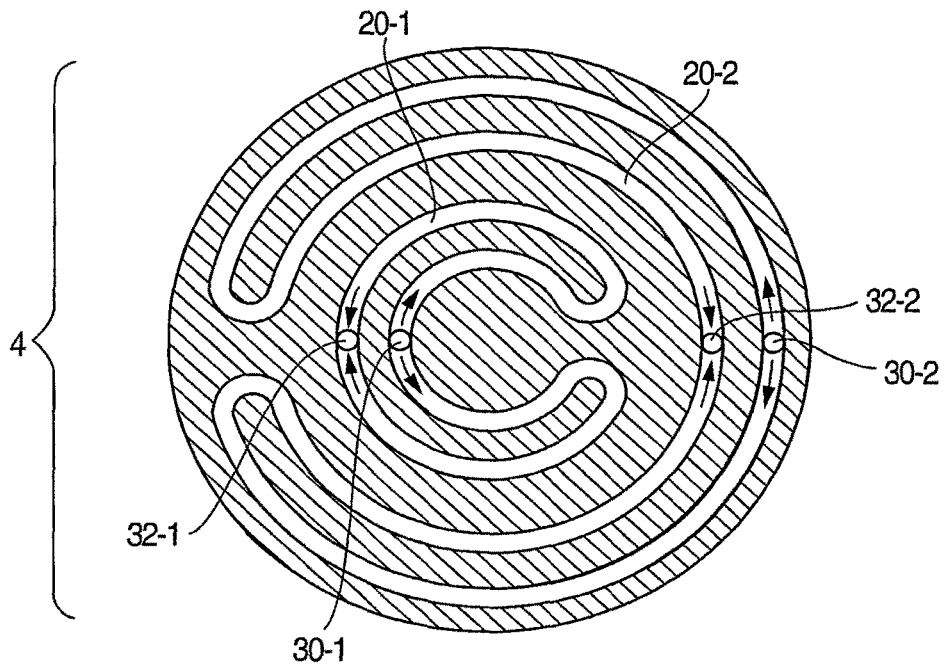
FIG. 2 is a cross-sectional diagram schematically illustrating a configuration of a sample stage in the embodiment illustrated in FIG. 1.

A configuration of the refrigerant channels will be described in more detail below with reference to FIG. 2. FIG. 2 is a cross-sectional diagram schematically illustrating a configuration of the sample stage in the embodiment illustrated in FIG. 1.

As illustrated in the Figure, the refrigerant channels 20 include multiple channels that are concentrically arranged and overlap in a radial direction inside the sample stage 4 having a cylindrical shape or a circular plate shape in transverse cross section, and each includes an inlet and an outlet for a refrigerant. More specifically, the refrigerant channels 20 include a plurality of concentric channels including a center-side refrigerant channel 20-1 and an outer periphery-side refrigerant channel 20-2 on the center side and the outer periphery side of the sample stage 4 and the sample 5.

These two channels each include an inlet and an outlet for a refrigerant, and refrigerants in different conditions are supplied to, and circulate in, the channels. For example, if a temperature at which a refrigerant circulating in the center-side refrigerant channel 20-1 evaporates is made to higher than an evaporation temperature of the refrigerant circulating in the outer periphery-side refrigerant channel 20-2, a temperature distribution in a surface of the sample stage 4 and in the radial direction of the sample 5 exhibit high temperatures at the center-side portion, and if the temperature values are plotted on a graph, the graph exhibits a convex distribution in which exhibits high values in a center part and low values in outer peripheral parts. Conversely, if the evaporation temperature of the refrigerant circulating in the center-side refrigerant channel 20-1 is made to be lower than the evaporation temperature of the refrigerant circulating in the outer periphery-side refrigerant channel 20-2, a temperature distribution in the surface of the sample stage 4 and in the radial direction of the sample 5 exhibit a concave distribution.

As illustrated in FIG. 1, the refrigerant channels 20 in the sample stage 4 form a part of the refrigeration cycle, the part being connected to components such as a compressor 22 and expansion valves 24-1, 24-2, 24-3 and 24-4 arranged outside the sample stage 4 via refrigerant ducts in which a refrigerant flows. In such configuration, a refrigerant draws latent heat as a result of evaporation by means of heat exchange in the refrigerant channels 20 in the sample stage 4, condenses outside the sample stage 4, releases the latent heat, and devolatilizes again.

The center-side refrigerant channel 20-1 includes a center-side refrigerant inlet 30-1 and a center-side refrigerant outlet 32-1 inside, and a refrigerant is introduced into the center-side refrigerant channel 20-1 from the center-side refrigerant inlet 30-1 via expansion valve 24-1. In the present embodiment, the refrigerant introduced into the center-side refrigerant inlet 30-1 is split into two sides, i.e., in clockwise and counterclockwise directions, along a circumference of the refrigerant channel arranged in the form of a circular arc, and the split refrigerants flow through the center-side refrigerant channel 20-1 and merge at the outer periphery-side refrigerant outlet 32-1 arranged in an outer periphery-side part of the center-side refrigerant channel 20-1 in which the center-side refrigerant inlet 30-1 is arranged, and the merged refrigerant flows out from the center-side refrigerant channel 20-1 and flows toward the compressor 22 via the expansion valve 24-3.

Likewise, the refrigerant is introduced into the outer periphery-side refrigerant channel 20-2 through an outer periphery-side refrigerant inlet 30-2 via the expansion valve 24-2, and is split into two sides and the split refrigerants flow through the outer periphery-side refrigerant channel 20-2 and merge at an outer periphery-side refrigerant outlet 32-2 arranged in a center-side part of the outer periphery-side refrigerant channel 20-2 in which the outer periphery-side refrigerant inlet 30-2 is arranged and the merged refrigerant flows toward the compressor 22 via the expansion valve 24-4.

In the present embodiment, a flow rate or a pressure of the refrigerant flowing out from the center-side refrigerant channel 20-1 and a flow rate or a pressure of the refrigerant flowing out from the outer periphery-side refrigerant channel 20-2 are adjusted at the respective expansion valves 24-3 and 24-4 arranged on the respective refrigerant ducts connected to the center-side refrigerant outlet 32-1 and the outer periphery-side refrigerant outlet 32-2. The expansion valves 24-3 and 24-4 each include a valve for variably adjusting a cross-sectional area of a refrigerant passage arranged inside, and the flow rate of the refrigerant is changed by increasing or decreasing the opening of the valve. Also, in the present embodiment, each of the expansion valves 24-3 and 24-4 may be one including a configuration that rapidly reduces an internal pressure in an internal passage to gasify the refrigerant to adjust the pressure of the refrigerant.

In the present embodiment, the refrigerant ducts connected to the expansion valves 24-3 and 24-4 are connected to the compressor on the refrigerant downstream side, and thus, the pressures of the refrigerants passing through the expansion valves 24-3 and 24-4 can also be decreased and adjusted by means of adjustment of the flow rates made by increasing/decreasing the openings. The refrigerants whose pressures have been adjusted through the expansion valves 24-3 and 24-4 subsequently merge in a merging section 52 in which the two refrigerant ducts merge, and the merged refrigerant is introduced into a refrigerant temperature adjustment section 21 in which a temperature of the refrigerant with latent heat absorbed is adjusted. The refrigerant temperature adjustment section 21, which is included in the refrigeration cycle including the refrigerant channels 20 in the sample stage 4 and is a part that makes the refrigerant perform heat exchange to release internal latent heat again to devolatilize, and includes an evaporator 26, the compressor 22 and a condenser 23, which are connected in this order via refrigerant ducts.

The refrigerant introduced into the refrigerant temperature adjustment section 21 is first introduced into the evaporator 26. The evaporator 26 includes a channel arranged at a position and with a configuration that enable heat exchange with the refrigerant duct in which the introduced refrigerant flows inside, in parallel to the refrigerant duct, the channel allowing water 25-1, which is a heat exchange medium for heat exchange with the refrigerant, to flow inside. In the present embodiment, the refrigerant flowing in the refrigerant duct has a decreased pressure after the passage through the expansion valves 24-3 and 24-4, and the refrigerant whose temperature has thus been decreased perform heat exchange with the water 25-1 flowing and circulating in the heat exchange medium channel in the evaporator 26 and thereby evaporates, and is gasified until a dryness or quality of substantially 1 is achieved.

The sample stage 4 including the refrigerant channels 20 in the present embodiment can also function as an evaporator, and the evaporator 26 also serves as a second evaporator. Also, as described later, the sample stage 4 has a configuration that can also operate as a condenser (heater for a sample) by variably adjusting pressures or evaporating pressures of the refrigerants in the refrigerant channels 20 inside the sample stage 4 by a balance among the openings of the expansion valves 24-1 to 24-4 provided by operations of the expansion valves 24-1 to 24-4.

The gasified refrigerant is introduced into an inlet of the compressor 22 and compressed inside the compressor 22, whereby the pressure of the refrigerant is increased. The high-pressure flowing out from an outlet of the compressor 22 is introduced into the condenser 23 and condenses. In the condenser 23, as with the evaporator 26, a channel in which water 25-2, which is a heat exchange medium, flows inside is arranged so as to exchange heat with the refrigerant duct, and the refrigerant introduced into the condenser 23 performs heat exchange with the water 25-2 flowing in the heat exchange medium channel and is thereby cooled, and condenses until a dryness or quality of substantially 0 is achieved. Although in the present embodiment, the water 25-1 and the water 25-2 are used as heat exchange mediums, other fluids may be used.

The refrigerant flowing out from the condenser 23 flows in the refrigerant duct toward the sample stage 4, and is split into two paths at a bifurcation section 50 arranged on the refrigerant duct. One of the two paths is a path with the expansion valve 24-1 arranged thereon, the path being connected to the center-side refrigerant channel 20-1 in the sample stage 4, and the other is a path with the expansion valve 24-2 arranged thereon, the path being connected to the outer periphery-side refrigerant channel 20-2. The expansion valves 24-1 and 24-2 have respective configurations that are the same as those of the expansion valves 24-3 and 24-4, the configurations variably increasing/decreasing a cross-sectional area of the passage of the refrigerant that passes inside the respective valve to adjust the flow rate of the refrigerant. Also, the valves may have a configuration that rapidly decreases a pressure inside the passage to gasify the refrigerant. Furthermore, since the compressor 22 is connected to the expansion valves 24-1 and 24-2 on the downstream side of the refrigeration cycle via the refrigerant ducts and the refrigerant channels 20 in the sample stage 4, only adjustment of the flow rate of the refrigerant by the expansion valves 24-1 and 24-2 enables adjustment of the pressure on the downstream side of the refrigerant.

Subsequently, the refrigerants flowing these paths are introduced into the inner peripheral-side refrigerant channel 20-1 and the outer periphery-side refrigerant channel 20-2 again, respectively, and perform heat exchange with the members included in the respective refrigerant channels in the sample stage 4 to boil and gasify and flow out from the sample stage 4, and flow toward the compressor 22 again via the expansion valves 24-3 and 24-4 to circulate. In the present embodiment, the openings of the expansion valves 24-1 to 24-4 are adjusted by a non-illustrated control section, whereby conditions such as evaporation temperatures of the refrigerants introduced into the center-side refrigerant channel 20-1 and the outer periphery-side refrigerant channel 20-2 are adjusted so as to fall within a desired value range.

For example, for the refrigerant introduced into the center-side refrigerant channel 20-1, if the opening of the expansion valve 24-1 connected to the inlet of the center-side refrigerant channel 20-1 is decreased and/or if the opening of the expansion valve 24-3 connected to the outlet of the center-side refrigerant channel 20-1 is increased, the pressure of the refrigerant flowing inside the center-side refrigerant channel 20-1, which is a refrigerant channel between these valves, is decreased, resulting in a decrease in a temperature (evaporation temperature) at which the refrigerant evaporates inside the channel. Conversely, if the opening of the expansion valve 24-1 is increased and/or if the opening of the expansion valve 24-3 is decreased, the pressure of the refrigerant circulating in the center-side refrigerant channel 20-1 is increased, resulting in an increase in evaporation temperature of the refrigerant.

Likewise, for the refrigerant introduced into the outer periphery-side refrigerant channel 20-2, if the opening of the expansion valve 24-2 is decreased and/or the opening of the expansion valve 24-4 is increased, the pressure of the refrigerant is decreased, resulting in a decrease in temperature of the refrigerant circulating in the outer periphery-side refrigerant channel 20-2. Conversely if the opening of the expansion valve 24-2 is increased and/or the opening of the expansion valve 24-4 is decreased, the pressure of the refrigerant is increased, resulting in an increase in temperature of the refrigerant circulating in the outer periphery-side refrigerant channel 20-2. The temperatures and the evaporation temperatures of the refrigerants flowing in the inner peripheral-side refrigerant channel 20-1 and the outer periphery-side refrigerant channel 20-2 are variably adjusted by increasing/decreasing the openings of the respective expansion valves 24-1 to 24-4, and the channels perform an operation as either of an evaporator (cooler for a sample) and a condenser (heater for a sample), which are switchable from each other.

In these cases, the temperatures of the refrigerants introduced into the center-side refrigerant channel 20-1 and the outer periphery-side refrigerant channel 20-2 are detected by a thermometer 40-1 and a thermometer 40-2, respectively, arranged on the respective refrigerant ducts downstream of the expansion valve 24-1 and the expansion valve 24-2 arranged on the refrigerant ducts connected to the respective inlets, between the respective valves and the center-side refrigerant inlet 30-1 and the outer periphery-side refrigerant inlet 30-2. Hereinafter, the temperatures of the refrigerants detected by the thermometer 40-1 and the thermometer 40-2 are referred to as T1 and T2, respectively.

In the present embodiment, the temperatures or evaporation temperatures of the refrigerants in the plurality of refrigerant channels, i.e., the center-side refrigerant channel 20-1 and the outer periphery-side refrigerant channel 20-2, which are branched and supplied from the refrigerant temperature adjustment section 21 including one direct expansion-type heat cycle, are made to fall within respective proper ranges by variable adjusting the openings of the expansion valves 24-1 to 24-4. In the present specification, one direct expansion-type heat cycle means a direct expansion-type heat cycle including one compressor.

Figure 3:
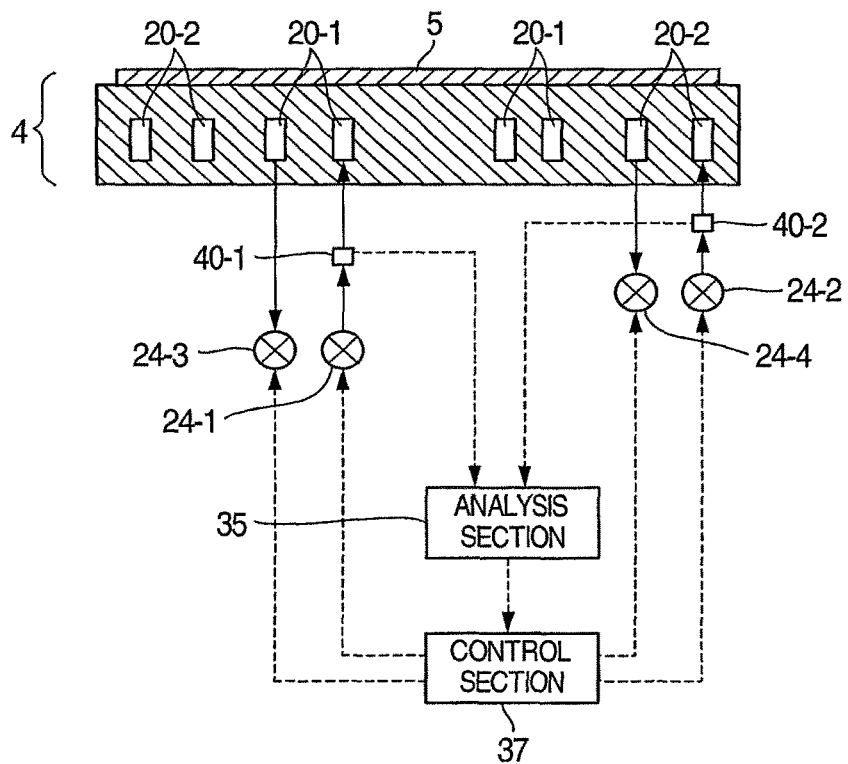
FIG. 3 is a diagram schematically illustrating a configuration that performs temperature control of the sample stage in the embodiment illustrated in FIG. 1.

A configuration for control of the openings of the expansion valves 24-1 to 24-4 will be described with reference to FIG. 3. FIG. 3 is a diagram schematically illustrating a configuration that performs temperature control of the sample stage in the embodiment illustrated in FIG. 1. In the Figure, flows of signals are indicated by dashed lines.

Respective signals indicating results of detection by the thermometer 40-1 and the thermometer 40-2 are transmitted via any of wire and wireless communications to an analysis section 35. The analysis section 35 detects respective refrigerant temperatures T1 and T2 based on the respective signals, and detects temperature values suitable for processing the sample 5 and necessary temperatures or evaporation temperatures of the refrigerants according to a distribution in the radial direction of the temperature values, and calculates proper openings of the expansion valves 24-1 to 24-4 according to the temperatures and the actual refrigerant temperatures T1 and T2 detected from the signals. Signals of the results of calculation are transmitted to a control section 37 via communications, and the control section 37 transmits instruction signals for achieving the calculated openings of the expansion valves 24-1 to 24-4 to the expansion valves 24-1 to 24-4 or drive devices therefor to adjust the openings of the expansion valves.

Although in the present embodiment, the analysis section 35 and the control section 37 are described as different members, the analysis section 35 and the control section 37 may be included in one integrated circuit, and thus may be included in a configuration in which a plurality of circuits arranged on one substrate can communicate with each other via wire or wireless communication circuits. Also, the analysis section 35 is a circuit that includes a memory, a computer and a communication interface inside, and the computer including, e.g., a microprocessor or a microcomputer reads an algorithm recorded in advance as software in a memory such as DRAM or ROM as the memory or in an external storage apparatus such as a hard disk drive or a CD-ROM drive, and based on the algorithm, calculates the temperatures or the openings, or the instruction signals, using signals received via the communication interface. The computer, the memory and the communication interface may be ones that have both functions of the analysis section 35 and the control section 37.

Next, a configuration in which the refrigerant temperatures of the center-side refrigerant channel 20-1 and the outer periphery-side refrigerant channel 20-2 are adjusted by control of the openings of the expansion valves 24-1 to 24-4 in the present embodiment will be described in more detail.

In the present embodiment, control of the temperatures of the respective refrigerants introduced to the center-side refrigerant channel 20-1 and the outer periphery-side refrigerant channel 20-2 is performed by adjusting the openings of the expansion valves 24-1 to 24-4. In other words, the openings of the expansion valves 24-1 to 24-4 are adjusted so that a conductance of a refrigerant path including the expansion valve 24-1, the center-side refrigerant channel 20-1 and the expansion valve 24-3, and the refrigerant ducts connecting them as components thereof is equal to a conductance of a refrigerant path including the expansion valve 24-2, the outer periphery-side refrigerant channel 20-2 and the expansion valve 24-4, and the refrigerant ducts connecting them as components thereof.

For example, for the refrigerant introduced into the center-side refrigerant channel 20-1, adjustment is made so that the opening of expansion valve 24-1 is decreased and the opening of the expansion valve 24-3 is increased. As a result of such operation, the pressure of the refrigerant in the refrigerant path between the expansion valve 24-1 and the expansion valve 24-3 decreases, resulting in a decrease in temperature or evaporation temperature of the refrigerant flowing in the center-side refrigerant channel 20-1. Conversely, adjustment is made so that the opening of the expansion valve 24-1 is increased and the opening of the expansion valve 24-3 is decreased. As a result of such operation, the pressure of the refrigerant flowing in the center-side refrigerant channel 20-1 increases, whereby the temperature or the evaporation temperature of the refrigerant is increased.

Likewise, for the refrigerant flowing in the outer periphery-side refrigerant channel 20-2, the opening of the expansion valve 24-2 is decreased and the opening of the expansion valve 24-4 is increased. Consequently, the pressure of the refrigerant decreases, resulting in a decrease in temperature or evaporation temperature of the refrigerant flowing in the outer periphery-side refrigerant channel 20-2. Conversely, the opening of the expansion valve 24-2 is increased and the opening of the expansion valve 24-4 is decreased. Consequently, the pressure of the refrigerant increases, and as a result, the temperature or the evaporation temperature of the refrigerant flowing in the outer periphery-side refrigerant channel 20-2 increases.

For performing the above-described operations of the expansion valves 24-1 and 24-3 and the expansion valves 24-2 and 24-4, the openings of the expansion valves are adjusted according to instructions from the analysis section 35 or the control section 37 so that the conductances of the refrigerant paths including the refrigerant channels 20 in the sample stage 4 between the respective valves are equal to each other. In other words, in the present embodiment, where the conductances of the expansion valves 24-1 to 24-4 are C1 to C4, respectively, the openings of the expansion valves are adjusted so as to satisfy expression 1 below.

$$1/C1+1/C3=1/C2+1/C4 \quad (1)$$

Consequently, the refrigerant conductance of the refrigerant path between the expansion valve 24-1 and the expansion valve 24-3 via the center-side refrigerant channel 20-1 and the conductance of the refrigerant path between the expansion valve 24-2 and the expansion valve 24-4 via the outer periphery-side refrigerant channel 20-2 are made to have values that are equal to each other or values that are approximate to each other enough to regard the values as being substantially equal to each other, and even under different processing conditions, the conductances are maintained equal to each other, whereby the flow rates of the respective refrigerants flowing in these paths are substantially equal to each other. Therefore, even when the openings of the expansion valves in one of the paths are changed in order to adjust the temperature of the refrigerant, the flow rate of the refrigerant in the other path is not affected by that change and can be maintained constant, and thus, the temperature of the refrigerant can be maintained constant if the openings of the expansion valves are not changed.

To be precise, the conductance of the center-side refrigerant channel 20-1 is included in the path between the expansion valve 24-1 and the expansion valve 24-3, and the conductance of the outer periphery-side refrigerant channel 20-2 is included in the path between the expansion valve 24-2 and the expansion valve 24-4; however, the present inventors have confirmed that since the conductances of the channels are large compared to the conductances of the expansion valves 24-1 to 24-4, adjustment of the openings of the expansion valves 24-1 to 24-4 that satisfies the expression 1 causes no failure.

Also, in the present embodiment, the expansion valves 24-1 to 24-4 have a same configuration, and same performance can be delivered even if any one of the expansion valves is replaced with another. More specifically, for these expansion valves 24-1 and 24-4, same units and same parts are employed, and even if an operation of any one of the expansion valves is performed by any other one of the expansion valves, same results of refrigerant flow rates or pressures are obtained. For adjustment of the openings of the expansion valves 24-1 to 24-4, the openings in a range in which conductances of refrigerants flowing in the respective expansion valves are proportional to the openings of the respective expansion valves. In such case, where V1 to V4 are the openings of the expansion valves 24-1 to 24-4, the openings of the respective expansion valves 24-1 to 24-4 are adjusted so as to satisfy the following expression 2.

$$1/V1+1/V3=1/V2+1/V4 \quad (2)$$

Figure 4:
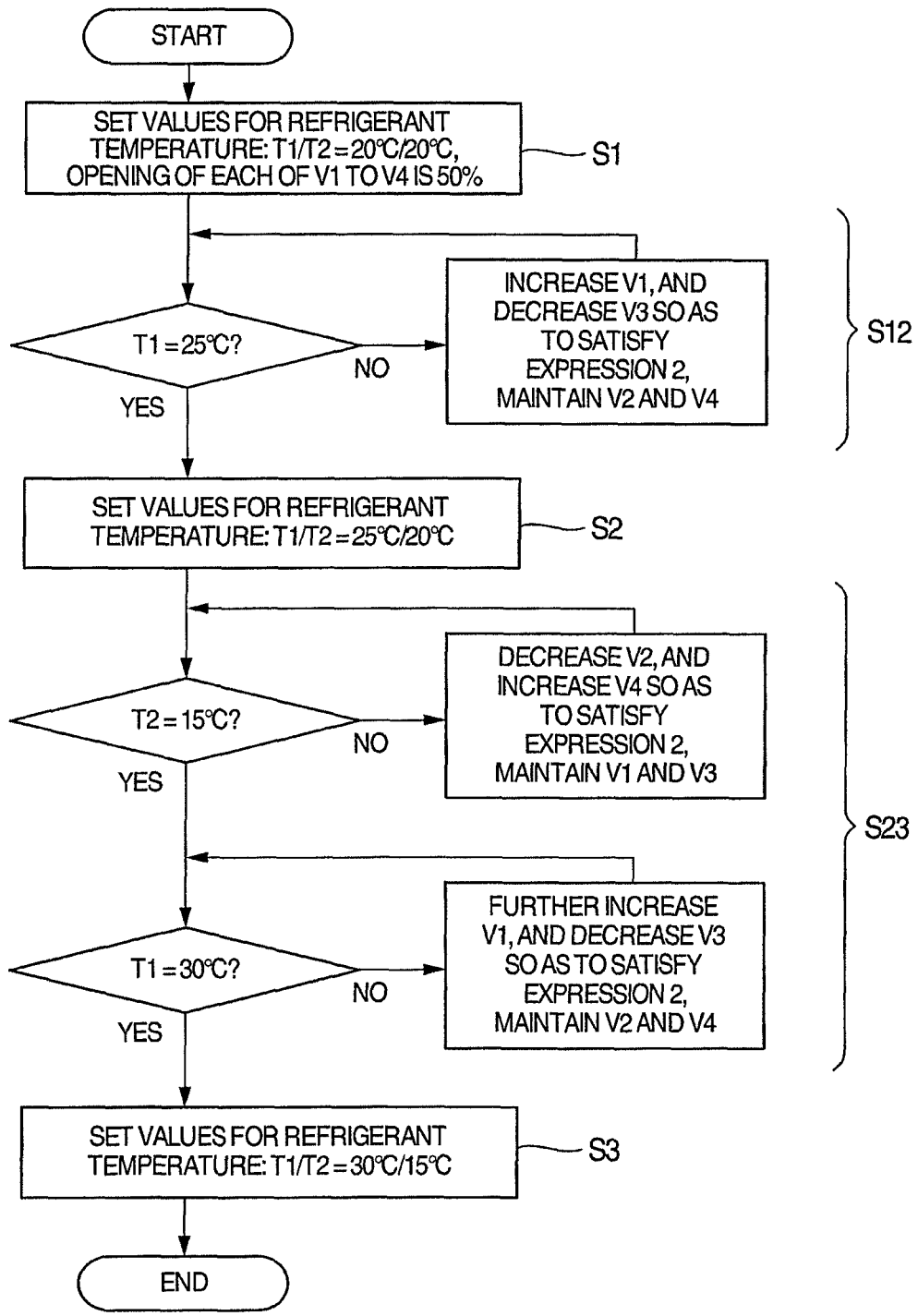
FIG. 4 is a flowchart illustrating the flow of operation for controlling temperatures of the sample stage in the embodiment illustrated in FIG. 1.
Figure 5:
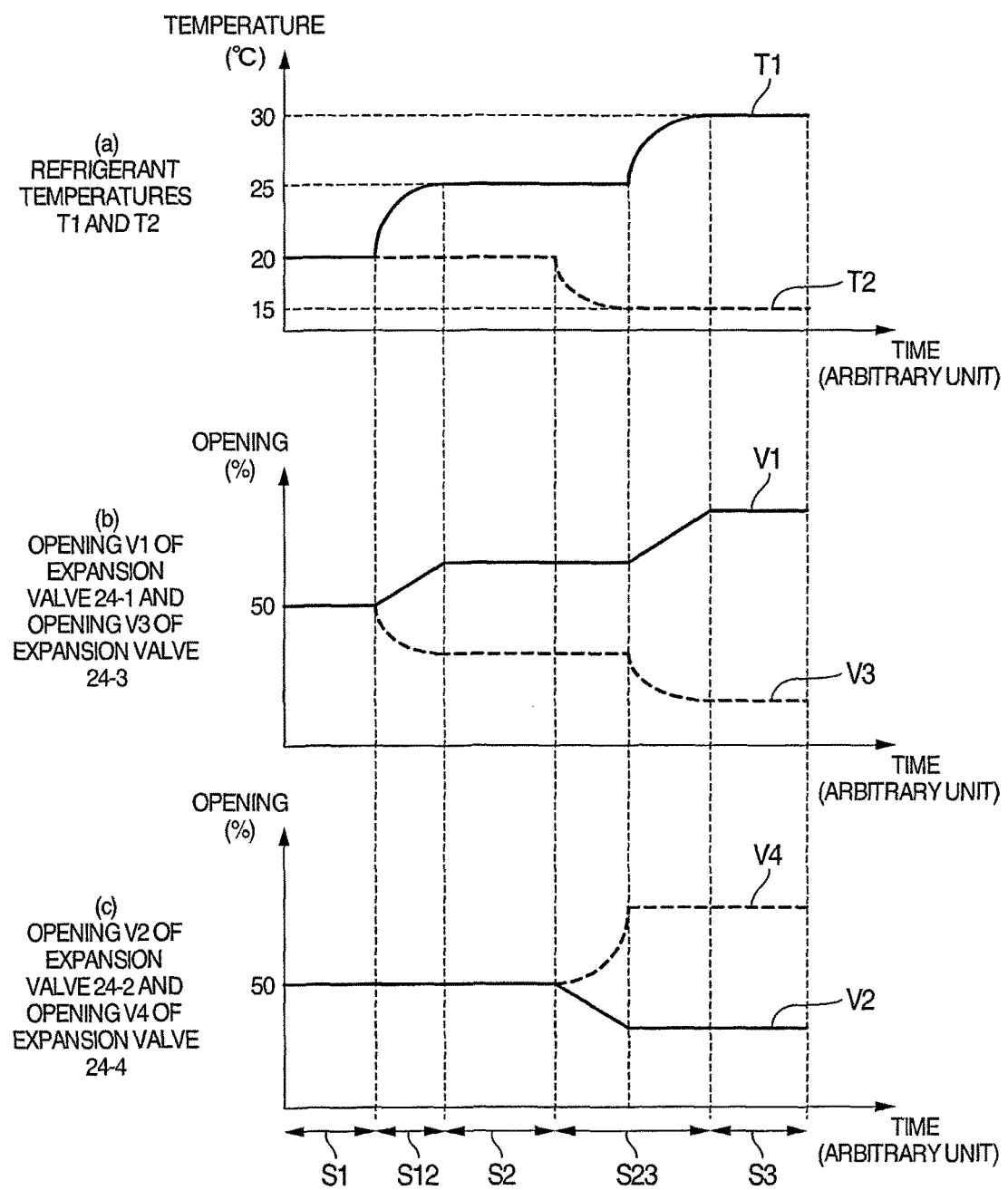
FIG. 5 includes time charts of openings of expansion valves and refrigerant temperatures when the plasma processing apparatus according the embodiment illustrated in FIG. 1 performs the operation illustrated in FIG. 4.

A flowchart for adjustment of the openings of the expansion valves 24-1 to 24-4 where the above-described configuration is employed in plasma etching using three different refrigerant temperature conditions, that is, including three steps is illustrated in FIG. 4, and time charts indicating change in openings of the expansion valves 24-1 and 24-4 and change in refrigerant temperatures are illustrated in FIG. 5. FIG. 4 is a flowchart illustrating the flow of operation for adjusting temperatures of the sample stage in the embodiment illustrated in FIG. 1. FIG. 5 is a diagram illustrating time charts of the openings of the expansion valves and adjusted fluid temperatures when the plasma processing apparatus according to the embodiment illustrated in FIG. 1 performs the operation indicated in FIG. 4.

Here, (a) in FIG. 5 is a time chart relating to refrigerant temperatures T1 and T2, (b) in FIG. 5 is a time chart relating to the opening V1 of the expansion valve 24-1 and the opening V3 of the expansion valve 24-3, and (c) in FIG. 5 is a time chart relating to the opening V2 of the expansion valve 24-2 and the opening V4 of the expansion valve 24-4. Hereinafter, an operation for adjustment of the openings of the expansion valves 24-1 and 24-4 will be described with reference to these Figures.

First, in step 1 (S1) of plasma etching, if set temperatures for T1 and T2 are 20° C., the respective openings of the expansion valves 24-1 to 24-4 are set to 50% from the refrigerant temperatures and a rotation speed of the compressor 22 (for example, 3000 rpm), based on database in the control section 37.

Next, when the processing transitions from step 1 (S1) to step 2 (S2) in which the set values for T1 and T2 are 25° C. and 20° C., respectively, as illustrated in FIG. 5, in transition step 12 (S12) between step 1 and step 2, it is necessary to change T1 from 20° C. to 25° C. without changing T2. In such case, V1 is increased while V3 is decreased: V3 is adjusted according to the change of V1 so as to satisfy the expression 2. Here, the refrigerant temperatures T1 and T2, which are measured by the thermometer 40-1 and the thermometer 40-2, are consistently measured, and adjustment of V1 and V3 is made until it is determined that T1 has reached the set value. Also, in transition step 12 (S12), there is no need to change T2, and thus V2 and V4 are maintained at 50%.

In transition step 12 (S12), if it is determined that T1 has reached the set value (25° C. in this case), it is determined that transition step S12 has been completed, and step 2 (S2) starts.

Next, if after an end of step 2 (S2), the processing transitions to step 3 (S3) in which the set values for T1 and T2 are 30° C. and 15° C., respectively, in a first half of transition step 23 (S23) between these steps, first, T2 is changed from 20° C. to 15° C. without changing T1. In such case, V2 is decreased while V4 is increased: V4 is adjusted according to the change of V2 so as to satisfy the expression 2. The adjustment of V2 and V4 are made until it is determined that T2 has reached the set value. Also, during that time period, V1 and V3 are maintained to make T1 constant.

In the first half of transition step 23 (S23), if it is determined that T2 has reached the set value (15° C. in this case), next, in a second half of transition step 23 (S23), adjustment for changing T1 to the set value (30° C. in this case) is made without changing T2. In that case, V1 is increased while V3 is decreased: V3 is adjusted according to change of the opening V1 so as to satisfy the expression 2. The adjustment of V1 and V3 is made until it is determined that T1 has reached the set value. Also, during that time period, V2 and V4 are maintained to make T2 constant.

In the second half of transition step 23 (S23), if it is determined that T1 has reached the set value, it is determined that transition step 23 (S23) has been completed, and step 3 (S3) starts, and if the step ends, the etching ends.

Although the openings of the expansion valves 24-1 and 24-4 described above are adjusted so as to satisfy the expression 2, while a set value for refrigerant temperature and T1 or T2 are compared with each other, the method for the adjustment is not limited to this method. For example, database is stored in advance in the control section 37, initial set values for V1 to V4 are estimated from set refrigerant temperatures, and first, V1 to V4 are set to the estimated values, and subsequently, fine adjustment of V1 to V4 is made so that T1 and T2 reach the set values.

Figure 6:
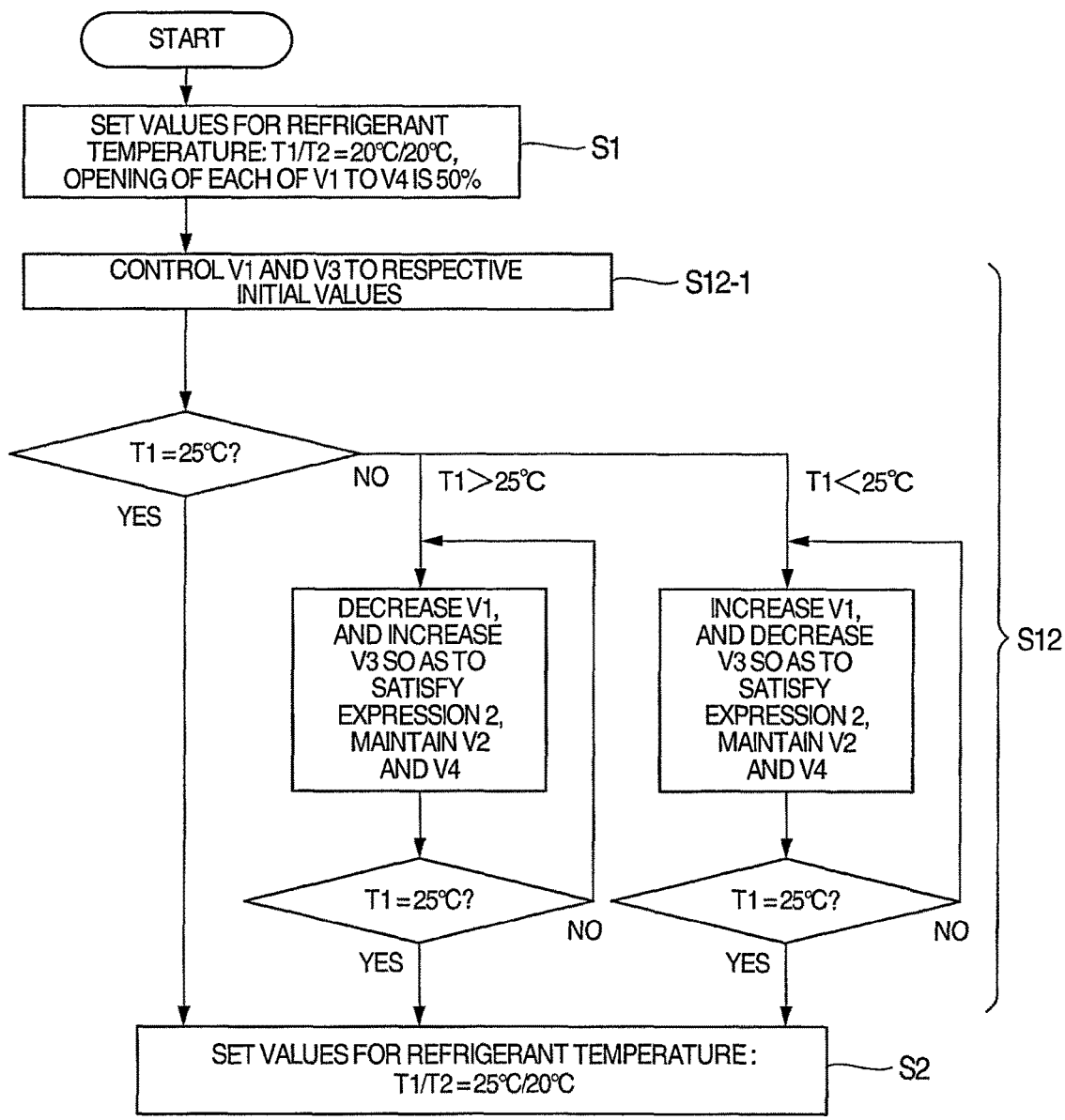
FIG. 6 is a diagram indicating a flowchart of operation for adjusting openings of the expansion valves according to the embodiment illustrated in FIG. 1.

An excerpt of a flowchart for a case where an operation for such adjustment is employed in transition step 12 (S12) is illustrated in FIG. 6. FIG. 6 is a diagram illustrating a flowchart of an operation for adjusting the openings of the expansion valves according to the embodiment illustrated in FIG. 1.

If the processing transition from step 1 (S1) to step 2 (S2) in which T1 and T2 are 25° C. and 20° C., respectively, first, initial set values for the openings V1 to V4 are estimated based on the database stored in the control section 37, and the openings are adjusted to those values. The initial set values satisfy the expression 2 (S12-1).

Next, whether or not T1 and T2 have the set values in step 2 (S2) is determined. In this case, the determination is made only for T1 because T2 remains unchanged. If T1 is higher than the set value (25° C. in this case), V1 is decreased so as to decrease T1, and V3 is increased so as to satisfy the expression 2. If T1 is lower than the set value, V1 is increased to increase T1, and V3 is decreased to satisfy the expression 2. In this case, V2 and V4 are maintained because T2 remains unchanged. If it is determined as a result of such adjustment that T1 has reached the set value, it is determined that transition step S12 has been completed, and step 2 (S2) starts.

As a result of such adjustment being made, T1 and T2 can be adjusted to set values by first adjusting V1 to V4 to initial set values and subsequently making fine adjustment of V1 to V4. Also, if the processing transitions to step 3 (S3) after completion of step 2 (S2), T1 and T2 can be adjusted to set values by adjusting V1 to V4 in transition step 23 (S23) between these steps in a manner similar to the above.

As a result of the above-described adjustment of the openings of the expansion valves 24-1 to 24-4, in a configuration in which temperatures of refrigerants in a plurality of routes, which are introduced into the sample stage 4, are adjusted by the refrigerant temperature adjustment section 21 including one direct expansion-type heat cycle, even if the temperature of the refrigerant in one route is changed, an effect of such change on the temperature of the refrigerant in the other route can be made to be small. Consequently, occurrence of hunting in adjustment of temperatures of the refrigerant in the respective refrigerant channels is suppressed, enabling efficient adjustment of the temperatures or the evaporation temperatures of the refrigerants. Also, even if such adjustment is made, the temperatures of the refrigerants are adjusted while the refrigerant flow rates in both routes are made to be equal to each other, decreasing the risk of dry-out, which easily occurs when a refrigerant flow rate is extremely reduced. Consequently, a distribution of temperatures in a circumferential direction of the sample stage 4 and the sample 5 is reduced.

[Variation 1]

In the above-described embodiment of the present invention, when temperatures of refrigerants in a plurality of routes are adjusted, the refrigerant temperature in one route is changed while the refrigerant temperature in the other route is maintained constant. However, enhancement in throughput of semiconductor manufacturing apparatuses demands quick adjustment of the refrigerant temperatures, and therefore, there may be cases where temperature adjustment quicker than the temperature adjustment method indicated in the embodiment is needed. Still furthermore, there may be cases where adjustment for quickly increasing or decreasing a difference between the refrigerant temperatures in the plurality of routes is needed. A variation for meeting such needs will be described in below.

In the variation, a configuration for refrigerant temperature adjustment in a plasma processing apparatus is similar to that indicated in the embodiment. Then, when the openings of expansion valves 24-1 to 24-4 are adjusted, openings V1 to V4 of the expansion valves 24-1 to 24-4 are adjusted so as to satisfy the following expression 3 below. In the present variation, the expansion valves 24-1 to 24-4 have a configuration that is the same as that of the embodiment.

$$V1=V4 \text{ and } V2=V3 \tag{3}$$

If the expression 3 is satisfied, both the expression 1 and the expression 2 are satisfied. Thus, flow rates of refrigerants introduced into a center-side refrigerant channel 20-1 and an outer periphery-side refrigerant channel 20-2 are equal to each other, and also are maintained equal to each other even under different processing conditions. This point is the same as the embodiment; however, if the openings of the expansion valves 24-1 to 24-4 are adjusted so as to satisfy the expression 3, a temperature of a refrigerant in one route is decreased when a temperature of a refrigerant in the other route is increased, that is, the temperatures in both routes are simultaneously changed in manners opposite to each other.

Figure 7:
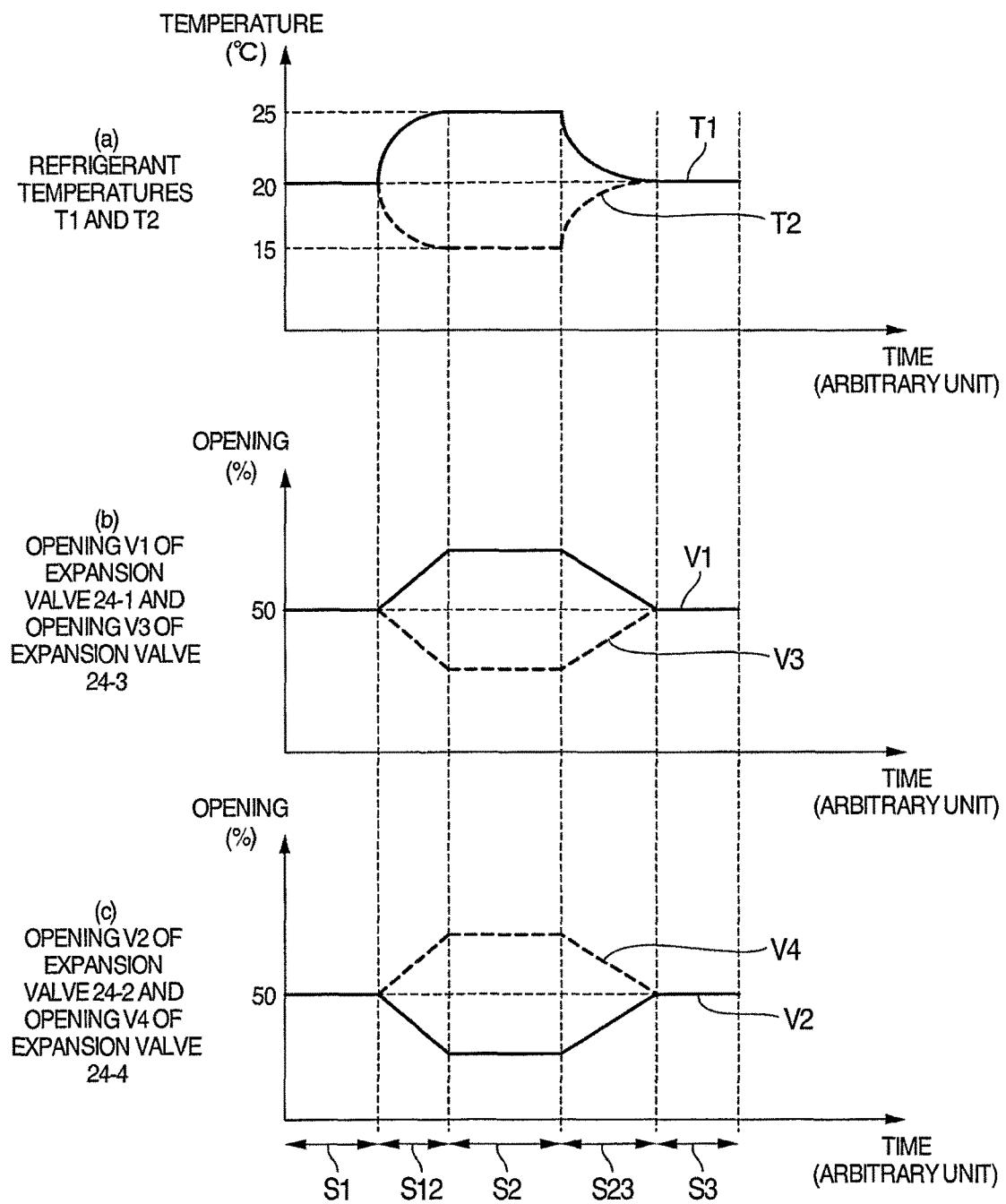
FIG. 7 includes time charts indicating change in openings of expansion valves and change in refrigerant temperatures according to a variation of the embodiment illustrated in FIG. 1.

A flowchart indicating change in opening of the expansion valves 24-1 to 24-4 and change in refrigerant temperatures when the above-described adjustment operation is employed in plasma etching using three different refrigerant temperatures, that is, including three steps is illustrated in FIG. 7. FIG. 7 includes time charts indicating change in openings of the expansion valves and change in refrigerant temperatures according to the variation of the embodiment illustrated in FIG. 1. Here, (a) in FIG. 7 is a time chart relating to refrigerant temperatures T1 and T2, (b) in FIG. 7 is a time chart relating to the opening V1 of the expansion valve 24-1 and the opening V3 of the expansion valve 24-3, and (c) in FIG. 7 is a time chart relating to the opening V2 of the expansion valve 24-2 and the opening V4 of the expansion valve 24-4.

In the Figure, first, in step 1 (S1) of the plasma etching, if set temperatures for T1 and T2 are both 20° C., each of the openings of the expansion valves 24-1 to 24-4 is set to 50% from the refrigerant temperatures and a rotation speed of a compressor 22, based on the database in a control section 37.

Next, when the processing transitions from step 1 (S1) to step 2 (S2) in which T1 and T2 are 25° C. and 15° C., respectively, in transition step 12 (S12) between these steps, V1 is increased while V3 is decreased in order to increase T1, and as with the change in V1 and V3, V4 is increased while V2 is decreased so as to satisfy the expression 3 in order to decrease T2. Consequently, T1 is increased while T2 is decreased, and T1 and T2 are adjusted to the respective set temperatures in step 2 (S2).

In transition step 12 (S12), if it is determined that T1 and T2 have reached the respective target temperatures (25° C. and 15° C., respectively, in this case), it is determined that transition step 12 (S12) has been completed, and step 2 (S2) starts.

Next, when the processing transitions to step 3 (S3) in which the set values for T1 and T2 are both 20° C. after completion of step 2 (S2), in transition step 23 (S23) between these steps, V3 is increased while V1 is decreased, and as with the change in V1 and V3, V4 is decreased while V2 is increased so as to satisfy the expression 3. Consequently, T1 is decreased while T2 is increased, whereby T1 and T2 are adjusted to the respective set temperatures in step 3 (S3). In transition step 23 (S23), if it is determined that T1 and T2 have reached target temperatures (both 20° C. in this case), it is determined that transition step 23 (S23) has been completed, and step 3 (S3) starts, and when the step ends, the etching ends.

As a result of the above-described adjustment of the openings of the expansion valves 24-1 to 24-4 being made, in a configuration in which temperatures of refrigerants in a plurality of routes, which are introduced into a sample stage 4, are adjusted by a refrigerant temperature adjustment section 21 including one direct expansion-type heat cycle, a difference between the temperatures of the refrigerants in the plurality of routes can be expanded or reduced in a shorter period of time. Also, even if the temperature of the refrigerant in one route is changed, an effect of such change on the temperature of the refrigerant in the other route can be made to be small. Consequently, occurrence of hunting in adjustment of the temperatures of the refrigerants in the respective refrigerant channels is suppressed, enabling efficient adjustment of the temperatures or evaporation temperatures of the refrigerants. Also, when such adjustment is made, also, the refrigerant temperature adjustment is made while the flow rates of the refrigerants in both routes are made to be equal to each other, decreasing the risk of dry-out, which easily occurs when a refrigerant flow rate is extremely reduced. Consequently a distribution of temperatures in a circumferential direction of a sample stage 4 and a sample 5 is reduced.

[Variation 2]

In the above-described embodiment and variation, the temperatures of the refrigerants introduced to the center-side refrigerant channel 20-1 and the outer periphery-side refrigerant channel 20-2 inside the sample stage 4 are adjusted only by adjustment of the openings of the expansion valves 24-1 to 24-4. However, in such case, a range of temperatures that can be provided by adjustment may be small. For example, there is the problem that the above-described embodiment and variation cannot respond to a case where a refrigerant temperature that is lower than temperatures provided only by adjustment of the openings of the expansion valves 24-1 to 24-4 is needed.

Also, although in the adjustment of the expansion valves 24-1 to 24-4 indicated in the variation, it is possible to quickly expand or reduce a difference between temperatures of the refrigerants in the plurality of routes, there are temperature conditions that cannot be met. For example, it is possible to adjust T1 and T2 in both routes from 20° C. in step 1 (S1) to 25° C. and 15°, respectively, as indicated in the variation; however, it is difficult to adjust T1 and T2 to 25° C. and 10° C., respectively, only by the method indicated in the variation.

Figure 8:
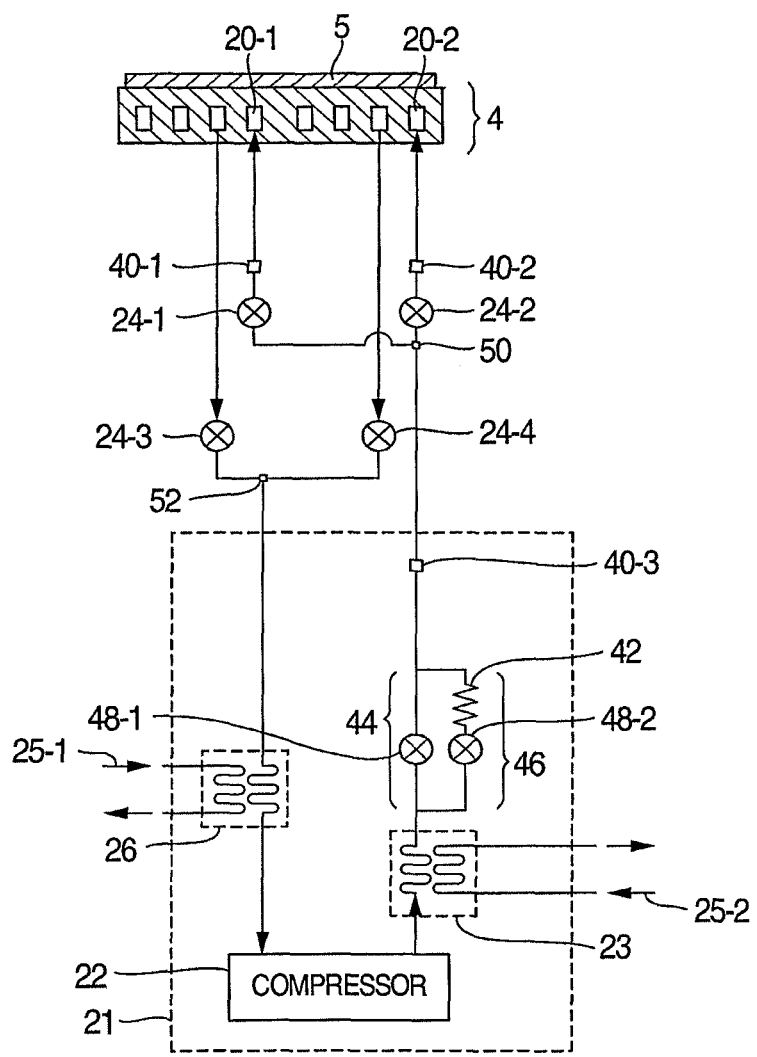
FIG. 8 is a vertical cross-sectional diagram schematically illustrating a configuration of a refrigerant temperature adjustment section according to another variation of the embodiment illustrated in FIG. 1.

Variation 2 of the embodiment of the present invention responds to these problems. A configuration of an apparatus according to variation 2 of the present invention will be described with reference to FIG. 8. FIG. 8 is a vertical cross-sectional diagram schematically illustrating a configuration of a refrigerant temperature adjustment section according to another variation of the embodiment illustrated in FIG. 1. The apparatus is one obtained by addition of a main line 44, a bypass line 46 and a thermometer 40-3 between the condenser 23 and the bifurcation section 50 in the configuration illustrated in FIG. 1. In the present variation, also, expansion valves 24-1 to 24-4 have a configuration that is the same as those in the embodiment.

A refrigerant condensed in the condenser 23 is introduced to the main line 44 or the bypass line 46. A valve 48-1 and a valve 48-2 are connected to the main line 44 and the bypass line 46, respectively, and flow rates of refrigerants flowing in the lines are adjusted by opening/closing, or increasing/decreasing openings of, the respective valves.

If the opening of the valve 48-1 is large and the opening of the valve 48-2 is small, a majority of the refrigerant flows through the main line 44. Meanwhile, if the opening of the valve 48-1 is small and the opening of the valve 48-2 is large, a majority of the refrigerant flows through the bypass line 46. In this case, the refrigerant flows through a capillary 42 provided downstream of the valve 48-2. The capillary 42 is formed by a narrow tube with a low conductance, and when the refrigerant flows through the capillary 42, a pressure of the refrigerant is decreased. In other words, where a majority of the refrigerant flows through the bypass line 46, the pressure of the refrigerant is decreased compared to a case where a majority of the refrigerant flows through the main line 44, and as a result, a temperature of the refrigerant is decreased.

A temperature of the refrigerant that has flowed through the main line 44 and the bypass line 46 is measured by the thermometer 40-3. The temperature (also referred to as T3) measured by the thermometer 40-3 subsequently serves as a base temperature for temperatures T1 and T2 of the refrigerant finally determined by adjustment of the expansion valves 24-1 to 24-4. The openings of the valve 48-1 and the valve 48-2 are adjusted by an analysis section 35 and a control section 37. As a result, flow rates of the refrigerants flowing in the main line 44 and the bypass line 46 are adjusted, and consequently, T3 is adjusted.

Where adjustment of the openings of the expansion valves 24-1 to 24-4 described in the above-described embodiment is employed in the configuration illustrated in FIG. 8, in a configuration in which temperatures of refrigerants in a plurality of routes, which are introduced into a sample stage 4, are adjusted by a refrigerant temperature adjustment section 21 including one heat cycle, even if the temperature of the refrigerant in one route is changed, an effect of such change on the temperature of the refrigerant in the other route can be eliminated, and a refrigerant temperature range can be widened by adjustment of the thermometer 40-3. For example, if it is desired to decrease set values for T1 and T2, it is only necessary to decrease the opening of the valve 48-1 and increase the opening of the valve 48-2. For such adjustment, the valve 48-1 and the valve 48-2 are adjusted by the analysis section 35 and the control section 37 to adjust T3, and subsequently, T1 and T2 are finally adjusted by the expansion valves 24-1 to 24-4.

Also, when adjustment of the openings of the expansion valves 24-1 and 24-4 described in variation 1 is employed in the configuration illustrated in FIG. 8 and it is desired to make set temperatures for T1 and T2 be 25° C. and 10° C., respectively, such set temperatures can be provided by decreasing the opening of the valve 48-1 and increasing the opening of the valve 48-2 to decrease T3 and making V1 and V4 be larger and making V2 and V3 be smaller compared to the conditions indicated in FIG. 7 to expand a temperature difference between T1 and T2.

As described above, even if the refrigerant temperature adjustment method indicated in the above-described embodiment or variation 1, the temperature range can be widened to the low-temperature side.

As a result of any of the embodiment and the variations described above, when a temperature adjustment section including one direct expansion-type heat cycle is employed in a plasma processing apparatus to adjust temperatures of respective refrigerants in a plurality of routes, occurrence of hunting and/or dry-out in refrigerant temperature adjustment can be suppressed.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for processing a sample that is an object to be processed by plasma, by mounting the sample on an upper surface of a sample stage arranged in a processing chamber inside a vacuum container and forming the plasma in the processing chamber,
    the sample stage including a refrigerant inlet and a refrigerant outlet arranged in each of a plurality of refrigerant channels that are concentrically arranged inside the sample stage and configured to allow a refrigerant to flow inside, and configured to function as a first evaporator,
    wherein the sample stage is included in a refrigeration cycle including a plurality of upstream-side expansion valves and a plurality of downstream-side expansion valves connected to the respective refrigerant inlets and the respective refrigerant outlets to adjust a flow rate or a pressure of a refrigerant flowing into the respective refrigerant inlets and a flow rate or a pressure of a refrigerant flowing out from the respective refrigerant outlets, in which a compressor, a condenser, the plurality of upstream-side expansion valves, the plurality of refrigerant channels, the plurality of downstream-side expansion valves and a second evaporator are connected in this order via a refrigerant duct to allow the refrigerant to flow therethrough in the recited order, the method comprising:
    adjusting openings of the plurality of upstream-side expansion valves and openings of the plurality of downstream-side expansion valves so that no change in flow rate of the refrigerant occurs in a plurality of refrigerant paths between the plurality of upstream-side expansion valves and the plurality of downstream-side expansion valves via the plurality of refrigerant channels;
    wherein the plurality of refrigerant channels includes a center-side refrigerant channel arranged on a center side of the sample stage and an outer periphery-side refrigerant channel arranged on an outer periphery side of the sample stage; and
    wherein the method further comprises adjusting openings of the plurality of upstream-side expansion valves and the openings of the plurality of downstream-side expansion valves so that a sum of reciprocals of refrigerant conductances of the upstream-side expansion valve and the downstream-side expansion valve connected to the center-side refrigerant channel is equal to a sum of reciprocals of refrigerant conductances of the upstream-side expansion valve and the downstream-side expansion valve connected to the outer periphery-side refrigerant channel.

2. The plasma processing method according to claim 1, further comprising adjusting the openings of the plurality of upstream-side expansion valves and the openings of the plurality of downstream-side expansion valves so that no change in flow rate of the refrigerant occurs in the plurality of refrigerant paths, the flow rate being detected based on a result of detection by each of detectors that are arranged on a plurality of refrigerant ducts between the plurality of upstream-side expansion valves and the respective refrigerant inlets of the plurality of refrigerant channels and detect respective temperatures of the refrigerants flowing in the respective refrigerant ducts.

3. The plasma processing method according to claim 1, wherein the plurality of downstream-side expansion valves include a common configuration; and
    wherein the method further comprises adjusting openings of the plurality of upstream-side expansion valves and the opening of the plurality of downstream-side expansion valves so that a sum of reciprocals of the openings of the upstream-side expansion valve and the downstream-side expansion valve connected to the center-side refrigerant channel is equal to a sum of reciprocals of the openings of the upstream-side expansion valve and the downstream-side expansion valve connected to the outer periphery-side refrigerant channel.

4. The plasma processing method according to claim 3, wherein the method further comprises adjusting openings of the plurality of upstream-side expansion valves and the openings of the plurality of downstream-side expansion valves so that a sum of the opening of the downstream-side expansion valve connected to the center-side refrigerant channel and the opening of the upstream-side expansion valve connected to the outer periphery-side refrigerant channel is equal to a sum of the opening of the upstream-side expansion valve connected to the center-side refrigerant channel and the opening of the downstream-side expansion valve connected to the outer periphery-side refrigerant channel.

* * * * *